United States Patent
Miki et al.

(10) Patent No.: US 7,749,785 B2
(45) Date of Patent: Jul. 6, 2010

(54) MANUFACTURING METHOD OF GROUP III NITRIDE SEMICONDUCTOR LIGHT-EMITTING DEVICE

(75) Inventors: Hisayuki Miki, Chiba (JP); Yasumasa Sasaki, Kamakura (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/302,123

(22) PCT Filed: May 1, 2008

(86) PCT No.: PCT/JP2008/058374

§ 371 (c)(1),
(2), (4) Date: Nov. 24, 2008

(87) PCT Pub. No.: WO2008/136504

PCT Pub. Date: Nov. 13, 2008

(65) Prior Publication Data

US 2009/0142870 A1   Jun. 4, 2009

(30) Foreign Application Priority Data

May 2, 2007   (JP) .............................. 2007-121541

(51) Int. Cl.
   *H01L 21/00* (2006.01)
   *H01L 21/31* (2006.01)
(52) U.S. Cl. .............................. 438/43; 438/47; 438/767
(58) Field of Classification Search .................... 438/46, 438/47, 767; 257/E21.127
   See application file for complete search history.

(56) References Cited

U.S. PATENT DOCUMENTS

| 5,122,845 A | 6/1992 | Manabe et al. |
| 5,290,393 A | 3/1994 | Nakamura |
| 2006/0183625 A1* | 8/2006 | Miyahara .................. 501/98.4 |
| 2007/0012943 A1 | 1/2007 | Okahisa et al. |

FOREIGN PATENT DOCUMENTS

| JP | 60-039819 A | 3/1985 |
| JP | 04-297023 A | 10/1992 |
| JP | 07-235692 A | 9/1995 |

(Continued)

OTHER PUBLICATIONS

"Epitaxial growth and structural analysis of AlN/GaN heterostructures." Yao-Z-Q, Zou-Y-S, Yang-Y, Zhang-W-J, Lee-S-T, Zhang-Y-Z, Ye-Z-Z. Applied Physics Letters, Nov. 26, 2007, vol. 91, No. 22, p. 221912-1-3, Publisher: American Institute of Physics, USA.*

(Continued)

*Primary Examiner*—William M. Brewster
(74) *Attorney, Agent, or Firm*—Sughrue Mion, PLLC

(57) ABSTRACT

The present invention provides a manufacturing method of a group III nitride semiconductor light-emitting device, including a lamination step of forming a plurality of lamination films including a group III nitride semiconductor on a substrate, in which a substrate on which is formed a foundation layer including a monocrystalline group III nitride semiconductor is used as the substrate, and lamination films are formed on the foundation layer by a sputtering method, with the substrate including the foundation layer and a target made from a group III metal or an alloy including a group III metal being placed in a sputtering chamber.

12 Claims, 2 Drawing Sheets

FOREIGN PATENT DOCUMENTS

| | | |
|---|---|---|
| JP | 09-063962 A | 3/1997 |
| JP | 3026087 B2 | 1/2000 |
| JP | 2006-193348 A | 7/2006 |

OTHER PUBLICATIONS

P. Singh, et al., "Growth and characterization of GaN thin films by magnetron sputter epitaxy," Journal of Vacuum Science and Technology A, 1998, pp. 786-789, vol. 16, No. 2.

W. J. Meng, et al., "Strain effects in epitaxial GaN grown on AlN-buffered Si(111)," Journal of Applied Physics, 1994, pp. 7824-7828, vol. 76, No. 12.

Y. Ushiku, et al., Proceedings of the 21st Century Consortium Symposium, 2003, pp. 295-298, vol. 2, English abstract.

T. Kikuma, et al., "GaN films deposited by planar magnetron sputtering," Vacuum, 2002, pp. 233-237, vol. 66.

* cited by examiner

MANUFACTURING METHOD OF GROUP III NITRIDE SEMICONDUCTOR LIGHT-EMITTING DEVICE

TECHNICAL FIELD

The present invention relates to a manufacturing method of a group III nitride semiconductor represented by a general formula of $Al_aGa_bIn_cN$ (where $0 \leq a \leq 1$, $0 \leq b \leq 1$, $0 \leq c \leq 1$, $a+b+c=1$), more particularly to a manufacturing method of a group III nitride semiconductor light-emitting device in the case of depositing a crystalline film with the same composition of that of the topmost surface.

Priority is claimed on Japanese Patent Application No. 2007-121541, filed on May 2, 2007, the contents of which are incorporated herein by reference.

BACKGROUND ART

Group III nitride semiconductors have a direct transition band gap with energy corresponding to that from the visible light region to the ultraviolet light region, and hence are capable of light emission with high efficiency. Therefore, commercialized products using the semiconductor light-emitting device such as a light-emitting diode (hereinafter referred to as LED) or a laser diode (hereinafter referred to as LD) have been developed. Furthermore, they have a potential of offering characteristics that conventional III-V compound semiconductors cannot offer.

In general, a group III nitride semiconductor is manufactured by the metal organic chemical vapor deposition method (hereinafter referred to as MOCVD method), with trimethyl gallium (hereinafter referred to as TMG), trimethyl aluminum (hereinafter referred to as TMA), trimethyl indium (hereinafter referred to as TMI), and ammonia (hereinafter referred to as $NH_3$) as raw materials. The MOCVD method is a method of crystal growth in which a carrier gas including a gas of raw material(s) is carried to a surface of a substrate and the material(s) are caused to react on the heated surface of the substrate. Here, as the substrate, a monocrystalline wafer such as of SiC or $Al_2O_3$ (sapphire) (hereinafter referred to as hetero-substrate) is used. However, there is a large lattice mismatch between such a hetero-substrate and a group III nitride crystal that is epitaxially grown thereon. For example, there is a 16% lattice mismatch between GaN and $Al_2O_3$, and there is a 6% lattice mismatch between GaN and SiC. In the presence of such a large lattice mismatch, it is difficult to epitaxially grow a crystal directly on a substrate. Even if a crystal is grown, it is not possible to obtain a favorable crystal. Therefore, in the case where a group III nitride semiconductor crystal is epitaxially grown on a sapphire monocrystalline substrate or on an SiC monocrystalline substrate by the MOCVD method, methods as disclosed in Patent Document 1 and Patent Document 2 have been used where a layer that is called a low-temperature buffer layer made from aluminum nitride (hereinafter referred to as AlN) or AlGaN is deposited on the substrate, and a group III nitride semiconductor crystal is epitaxially grown on the low-temperature buffer layer at high temperatures.

In recent, substrates including a group III nitride have been commercially obtainable. However, they are still expensive and no advantage is found for their industrial use. On the other hand, as for wafers in which a group III nitride semiconductor is deposited on a topmost surface of a hetero-substrate by a technique such as the MOCVD method, it has been possible to obtain and manufacture them comparatively easily.

Studies in manufacturing a group III nitride semiconductor crystal by the sputtering method are underway as well. For example, Patent Document 3 describes deposition of GaN directly on a sapphire substrate by the sputtering method, with the aim of laminating high resistance GaN. The conditions used were: an ultimate vacuum of $5 \times 10^{-7}$ to $5 \times 10^{-8}$ Torr; argon and nitrogen gases circulated in the chamber; a gas pressure at the sputtering of $3 \times 10^{-2}$ to $5 \times 10^{-2}$ Torr; an RF voltage of 0.7 to 0.9 kV (20 to 40 W in terms of power); a distance between the substrate and the target of 20 to 50 mm; and a substrate temperature of 150 to 450° C. However, a foundation layer of the light-emitting device is not referred to as a target application of GaN. Moreover, no description of forming a layer on top of the GaN film is made.

Furthermore, it is disclosed in Non-Patent Document 1 that a GaN was deposited on a Si (100) surface and an $Al_2O_3$ (0001) surface by radio frequency magnetron sputtering using nitrogen gas. The substrate temperature was changed from room temperature to 900° C., with the deposition conditions of a total gas pressure of 2 mTorr and an input power of 100 W. According to the figure published in the research paper, the employed apparatus is one in which the target and the substrate are opposed to each other.

Furthermore, in Non-Patent Document 2, GaN was deposited with an apparatus in which the cathode and the target were opposed to each other and a mesh was interposed between the substrate and the target. According to this, the deposition conditions were: a pressure of 0.67 Pa in nitrogen gas; a substrate temperature of 84 to 600° C.; an input power of 150 W; and a distance of 80 mm between the substrate and the target.

Conventionally, attempts have been made to laminate group III nitride semiconductors such as GaN on a hetero-substrate by the sputtering method. However, with a substrate whose topmost surface is made from a group III nitride semiconductor, no case has been reported of a manufacture of a crystalline group III nitride semiconductor which is favorable enough to fabricate a device such as an LED with by the sputtering method.

To obtain a semiconductor film with a favorable crystallinity, it is necessary to rigidly define deposition conditions for the sputtering method. Furthermore, in a crystal deposition by a physical adsorption method such as the sputtering method, a growth mechanism is often adopted such that the crystallinity of the substrate is taken over without change. Consequently, if a crystal film is to be deposited by use of the sputtering method, the material and the crystallinity of the topmost surface of the substrate, on which a deposition is conducted, is important.

Patent Document 1: Japanese Patent No. 3026087
Patent Document 2: Japanese Unexamined Patent Publication, First Publication No. H04-297023
Patent Document 3: Japanese Unexamined Patent Publication, First Publication No. S60-39819
Non-Patent Document 1: Proceedings of the 21st Century Consortium Symposium, Vol. 2, p. 295 (2003)
Non-Patent Document 2: Vacuum, Vol. 66, p. 233 (2002)

DISCLOSURE OF INVENTION

The present invention has an object to provide a manufacturing method of a group III nitride semiconductor light-emitting device in which a group III nitride semiconductor layer with favorable crystallinity is deposited by use of the sputtering method.

To achieve the above object, the present invention provides the following.

(1) A manufacturing method of a group III nitride semiconductor light-emitting device, including a lamination step of forming a plurality of lamination films including a group III nitride semiconductor on a substrate, in which a substrate on which is formed a foundation layer including a monocrystalline group III nitride semiconductor is used as the substrate, the substrate including the foundation layer and a target made from a group III metal or an alloy including a group III metal is placed in a sputtering chamber, and the lamination films are formed on the foundation layer by a sputtering method.

(2) The manufacturing method of a group III nitride semiconductor light-emitting device according to (1), in which the foundation layer has a thickness of 1 μm or more.

(3) The manufacturing method of a group III nitride semiconductor light-emitting device according to (1) or (2), in which in the foundation layer, a full width at half maximum of an X-ray rocking curve (XRC) measurement is 300 arcsec or less in a (10-10) plane orientation.

(4) The manufacturing method of a group III nitride semiconductor light-emitting device according to (3), in which in the foundation layer, a full width at half maximum of an X-ray rocking curve (XRC) measurement is 150 arcsec or less in a (0002) plane orientation.

(5) The manufacturing method of a group III nitride semiconductor light-emitting device according to any of (1) to (4), in which the foundation layer is formed by a metal organic chemical vapor deposition method.

(6) The manufacturing method of a group III nitride semiconductor light-emitting device according to any of (1) to (4), in which a substrate temperature is 600° C. to 1200° C.

(7) The manufacturing method of a group III nitride semiconductor light-emitting device according to any of (1) to (4), in which a substrate temperature is 800° C. to 1000° C.

(8) The manufacturing method of a group III nitride semiconductor light-emitting device according to any of (1) to (7), in which the lamination films are formed by a sputtering method under a gas atmosphere composed of a gas including nitrogen atoms with a flow ratio of 20% to 80% and the balance of a gas including inert atoms.

(9) The manufacturing method of a group III nitride semiconductor light-emitting device according to (8), in which the gas atmosphere is composed of: a gas including nitrogen atoms which is made from a nitrogen gas; and a gas including inert atoms which is made from argon gas.

(10) The manufacturing method of a group III nitride semiconductor light-emitting device according to (8) or (9), in which the gas including nitrogen atoms has a flow ratio of 50% or less.

(11) The manufacturing method of a group III nitride semiconductor light-emitting device according to any of claims 1 to 10, in which when the lamination film is formed by a sputtering method, Mg and Zn are added as p-type dopants.

(12) The manufacturing method of a group III nitride semiconductor light-emitting device according to any of (1) to (10), in which when the lamination film is formed by a sputtering method, Si, Ge, and Sn are added as n-type dopants.

(13) The manufacturing method of a group III nitride semiconductor light-emitting device according to (11) or (12), in which the lamination film to which are added the p-type dopants and/or the n-type dopants is used as a contact layer for forming an electrode.

According to the present invention, it is possible to provide a manufacturing method of a group III nitride semiconductor light-emitting device in which a group III nitride semiconductor layer with a favorable crystallinity is deposited by use of the sputtering method.

DESCRIPTION OF THE REFERENCE SYMBOLS

1: substrate, 2: buffer layer, 3: foundation layer, 4: n-type contact layer, 5: n-type cladding layer, 6: barrier layer, 7: well layer, 8: p-type cladding layer, 9: p-type contact layer, 10: n-side electrode, 11: portion on which is formed n-side electrode of n-type contact layer, 12: p-electrode bonding pad, 13: transparent p-electrode, 20: multiple quantum well structure layer, 30: group III nitride semiconductor light-emitting device

BEST MODE FOR CARRYING OUT THE INVENTION

Embodiments of the present invention will be described using FIGS. 1 to 3.

Figure 1:
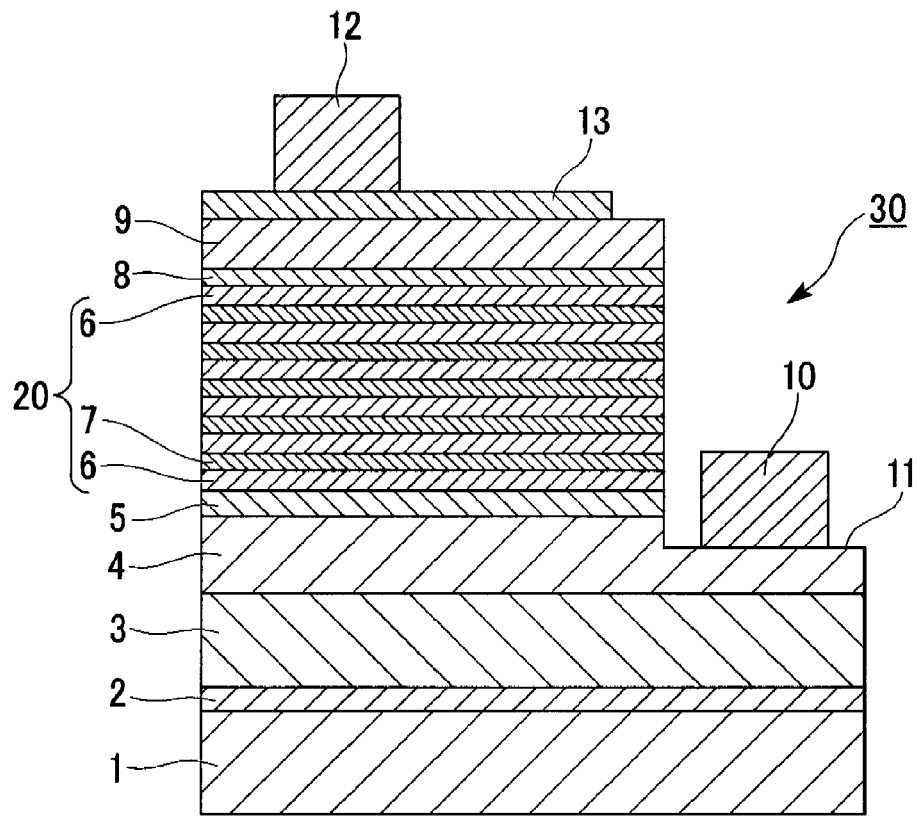
FIG. 1 is a schematic cross-sectional view showing one example of a group III nitride semiconductor light-emitting device fabricated by using a manufacturing method of a group III nitride semiconductor according to an embodiment of the present invention.

FIG. 1 is a schematic cross-sectional view showing one example of a group III nitride semiconductor light-emitting device 30 used in the present invention. FIG. 2 is an enlarged schematic cross-sectional view showing a part of the group III nitride semiconductor light-emitting device 30. FIG. 3 is a schematic plan view of the group III nitride semiconductor light-emitting device 30.

Figure 2:
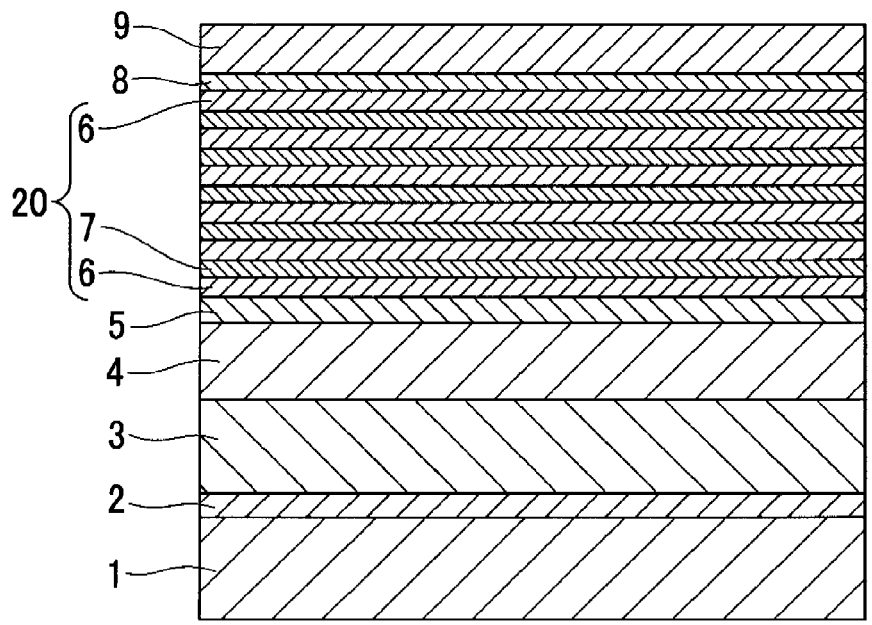
FIG. 2 is a schematic cross-sectional view showing one example of a part of a group III nitride semiconductor light-emitting device fabricated by using a manufacturing method of a group III nitride semiconductor according to an embodiment of the present invention.
Figure 3:
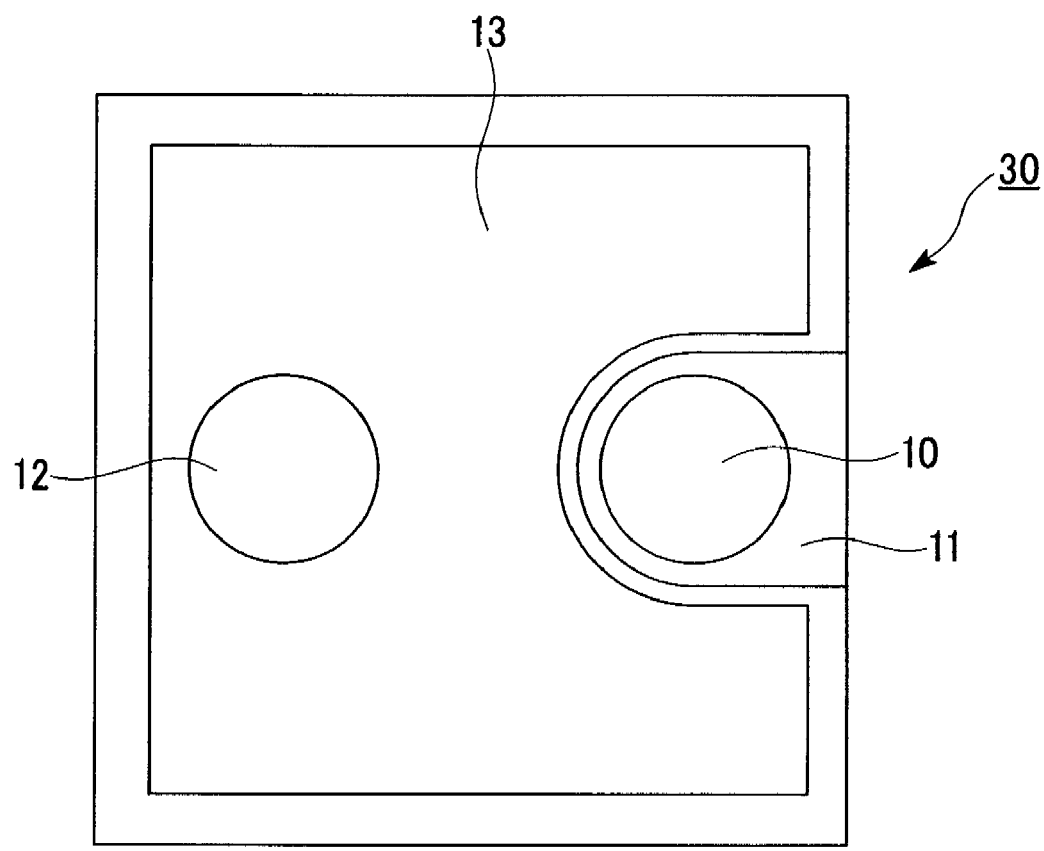
FIG. 3 is a schematic plan view showing one example of a group III nitride semiconductor light-emitting device fabricated by using a manufacturing method of a group III nitride semiconductor according to an embodiment of the present invention.

As shown in FIGS. 1 to 3, the group III nitride semiconductor light-emitting device 30 of the present invention is made of: a substrate 1; a buffer layer 2, a foundation layer 3, an n-type contact layer 4, an n-type cladding layer 5, a multiple quantum well structure layer 20, a p-type cladding layer 8, and a p-type contact layer 9 that are laminated on top of each other in this order. In addition, the multiple quantum well structure layer 20 is made of: a plurality of barrier layers 6; and a plurality of well layers 7. In addition, in an exposed surface portion 11 of the n-type contact layer 4, an n-electrode 10 is formed. Furthermore, on the p-type contact layer 9, a transparent p-electrode 13 and a p-electrode bonding pad 12 are formed.

Next is a detailed description of the respective layers.

[Substrate 1] In the present embodiment, the material usable for a substrate 1 is not particularly limited so long as it is a substrate material that allows the epitaxial growth of a group III nitride semiconductor crystal on its surface. For example, usable materials include: sapphire, SiC, silicon, zinc oxide, magnesium oxide, manganese oxide, zirconium oxide, zinc iron manganese oxide, aluminum magnesium oxide, zirconium diboride, gallium oxide, indium oxide, gallium lithium oxide, aluminum lithium oxide, gallium neodymium oxide, lanthanum strontium aluminum tantalum oxide, titanium strontium oxide, titanium oxide, hafnium, tungsten, and molybdenum. To laminate a group III nitride semiconductor with good crystallinity, a substrate with a hexagonal crystal structure such as of sapphire or SiC is preferable. Furthermore, a substrate on which a group III nitride semiconductor is laminated typically has a size of approximately 2 inches in diameter. However, in the case of using the manufacturing method of a group III nitride semiconductor according to an embodiment of the present invention, it is possible to use a substrate with a diameter of 4 to 6 inches.

[Buffer layer 2] In the present embodiment, a buffer layer 2 is formed as a layer for protecting the substrate 1 from a chemical reaction at high temperatures, for reducing a difference in lattice constant between the material of the substrate 1 and the semiconductor layer, or for prompting the generation of a nucleus for crystal growth.

The buffer layer 2 is formed so as to cover preferably at least 60% or more of the surface of the substrate 1, and most preferably 100%, that is, the entire surface of the substrate 1 without a gap. If the region of the surface of the substrate 1 covered by the buffer layer 2 is small, the substrate 1 is widely exposed, which may lead to the generation of a hillock or a pit. Furthermore, the buffer layer 2 may be formed so as to cover side surfaces of the substrate 1 in addition to the surface thereof, and furthermore may be formed so as to cover a back surface of the substrate 1.

In the case of using an oxide, a metal, or the like which is known to induce a chemical degeneration when exposed to ammonia gas at high temperatures as the substrate material, the buffer layer 2 acts also as a coat layer. Therefore, this is effective in preventing a chemical deterioration of the substrate 1.

[Foundation layer 3] In the present embodiment, a material usable for a foundation layer 3 is not necessarily the same as that of the buffer layer 2 formed on the substrate 1, and a different material may be used. However, it is preferable that the foundation layer 3 be made of an $Al_xGa_{1-x}N$ layer (where $0 \leq x \leq 1$, preferably $0 \leq x \leq 0.5$, more preferably $0 \leq x \leq 0.1$).

It is typically difficult to form a monocrystalline group III nitride semiconductor layer directly on a (0001) c-plane of the sapphire substrate 1 by the sputtering method, due to a difference in lattice constant between the sapphire substrate 1 and the group III nitride semiconductor layer. Therefore, a foundation layer 3 that is made from a monocrystalline group III nitride semiconductor and has good crystallinity is previously formed between the sapphire substrate 1 and the group III nitride semiconductor layer, and a group III nitride semiconductor is formed thereon by the sputtering method. Thereby, it is possible to form a single crystal of a group III nitride semiconductor with good crystallinity.

The foundation layer 3 may have a doped composition as required so long as n-type impurities are in the range of $1 \times 10^{17}$ to $1 \times 10^{19}/cm^3$. However, it may have an undoped ($<1 \times 10^{17}/cm^3$) composition. The undoped composition is preferable in terms of maintenance of favorable crystallinity. If the substrate 1 is conductive, it is possible to form electrodes on the top and the bottom of the light-emitting device by doping the foundation layer 3 with a dopant to impart conductivity. On the other hand, if an insulating material is used for the substrate 1, a chip structure is adopted where a positive electrode and a negative electrode are provided on the same surface of the light-emitting device. Therefore, using an undoped crystal as the layer directly above the substrate 1 offers a more favorable crystallinity. The n-type impurities are not particularly limited. For example, Si, Ge, Sn, and the like, preferably Si and Ge can be used.

[n-type contact layer 4] In the present embodiment, it is preferable that a material usable for an n-type contact layer 4 be made of an $Al_xGa_{1-x}N$ layer (where $0 \leq x \leq 1$, preferably $0 x < 0.5$, more preferably $0 \leq x \leq 0.1$), similar to the foundation layer 3. Furthermore, it is preferable that n-type impurities be doped. Inclusion of n-type impurities at a concentration of $1 \times 10^{17}$ to $1 \times 10^{19}/cm^3$, preferably $1 \times 10^{18}$ to $1 \times 10^{19}/cm^3$ is preferable in terms of maintaining a favorable ohmic contact with the negative electrode, in terms of suppressing the occurrence of a crack, and in terms of maintaining a favorable crystallinity. The n-type impurities are not particularly limited. For example, Si, Ge, Sn, and the like, preferably Si and Ge can be used. Furthermore, as described above, the n-type contact layer 4 may also serve as the foundation layer 3.

[n-type cladding layer 5] It is preferable that an n-type cladding layer 5 be provided between the aforementioned n-type contact layer 4 and a later-described multiple quantum well structure layer 20. In the present embodiment, it is possible to form the n-type cladding layer 5 by depositing AlGaN, GaN, $Ga_{1-n}N$ or the like. It may be formed by a heterojunction of these, or by a superlattice structure where these are laminated a plurality of times. The n-type cladding layer 5 is allowed to have an effect of, for example, electron supply to an active layer, or reducing the difference in lattice constant. Furthermore, the n-type cladding layer 5 plays a role of filling defective flatness that has occurred in the topmost surface of the n-type contact layer 4. If $Ga_{1-n}N$ is used for the n-type cladding layer 5, obviously it is preferable that in the n-type cladding layer 5, a band gap of $Ga_{1-n}N$ be wider than that of GaInN of the multiple quantum well structure layer 20, in order to prevent a re-absorption of the emitted light.

[Multiple quantum well structure layer 20] A multiple quantum well structure layer 20 of the present embodiment is made of alternately laminated barrier layers 6 and well layers 7. In the semiconductor element of the present invention, a barrier layer 6 is first formed on the n-type cladding layer 5, and a well layer 7 is formed on top of the barrier layer 6.

After five repetitions of this structure to form a lamination, a sixth barrier layer 6 is formed on a fifth well layer 7. Thereby, the multiple quantum well structure layer 20 is sandwiched by the barrier layers 6 on both surfaces. However, the number of these repeated structures is not particularly limited. The optimal number of repetitions is set for the characteristics and materials of the target element.

Furthermore, the thickness of the multiple quantum well structure layer 20 as a whole is not particularly limited. However, a thickness that allows a quantum effect to be obtained is preferable. For example, the multiple quantum well structure layer 20 preferably has a thickness in the range of 1 to 500 nm, more preferably around 100 nm. A thickness in this range contributes to an improvement in light-emission output.

A material used for the multiple quantum well structure layer 20 is a nitride-based compound semiconductor, for example a gallium nitride-based compound semiconductor represented by a general formula of $Al_XGa_YIn_ZN_{1-A}M_A$ (where $0 \leq x \leq 1$, $0 \leq y \leq 1$, $0 \leq z \leq 1$, and $X+Y+Z=1$, and the symbol M denotes a group V element different from nitrogen (N), and $0 \leq A < 1$). Also in the present invention, a gallium nitride-based compound semiconductor represented by a general formula of $Al_XGa_YIn_ZN_{1-A}M_A$ (where $0 \leq X \leq 1$, $0 \leq Y \leq 1$, $0 \leq Z \leq 1$, and $X+Y+Z=1$, and symbol M denotes a group V element different from nitrogen (N), and $0 \leq A < 1$), including known nitride-based compound semiconductor, can be used with no limitations whatsoever.

A gallium nitride-based compound semiconductor can include, apart from Al, Ga, and In, other group III elements. It can also include elements such as Ge, Si, Mg, Ca, Zn, Be, P, and As, as required. Furthermore, it may include not only intentionally added elements, but also impurities inevitably mixed depending on the deposition conditions and the like, and trace impurities contained in the raw material and the reaction tube material.

[Barrier layer 6] It is preferable that a material used for a barrier layer 6 be a gallium nitride-based compound semiconductor such as $Al_cGa_{1-c}N$ ($0 \leqq c \leqq 0.3$). Furthermore, it is required for the material to have band gap energy larger than that of a material used for a well layer 7.

[Well layer 7] It is preferable that a material used for a well layer 7 be a gallium nitride-based compound semiconductor including indium, such as $Ga_{1-s}In_sN$ (where $0<s<0.4$).

[p-type cladding layer 8] A material of a p-type cladding layer 8 is not particularly limited so long as it has a composition that allows its band gap energy to be larger than that of the multiple quantum well structure layer 20, and it can confine carriers to the multiple quantum well structure layer 20. A preferable material includes one with $Al_dGa_{1-d}N$ (where $0<d \leqq 0.4$, preferably $0.1 \leqq d \leqq 0.3$). Inclusion of such an AlGaN in the p-type cladding layer 8 is preferable in terms of confining carriers to the multiple quantum well structure layer 20. The p-type cladding layer 8 has a p-type doping concentration in the range of preferably $1\times10^{18}$ to $1\times10^{21}/cm^3$, more preferably $1\times10^{19}$ to $1\times10^{20}/cm^3$. With the p-type doping concentration in the above range, it is possible to obtain a favorable p-type crystal without decreasing the crystallinity.

[p-type contact layer 9] A p-type contact layer 9 is a gallium nitride-based compound semiconductor layer including at least $Al_eGa_{1-e}N$ (where $0 \leqq e \leqq 0.5$, preferably $0 \leqq 0.2$, more preferably $0 \leqq 0.1$). The Al composition in the above range is preferable in terms of maintaining a favorable crystallinity and in terms of a favorable ohmic contact with a p-ohmic electrode (see a transparent p-electrode 13, which will be described later). Furthermore, inclusion of a p-type dopant at a concentration in the range of $1\times10^{18}$ to $1\times10^{21}/cm^3$, more preferably $5\times10^{19}$ to $5\times10^{20}/cm^3$, is preferable in terms of maintaining a favorable ohmic contact, in terms of preventing occurrence of a crack, and in terms of maintaining a favorable crystallinity. The p-type impurities are not particularly limited. For example, Mg can be preferably used.

[N-electrode 10] The material used for an n-electrode 10 is not particularly limited so long as it has conductivity. For example, a material such as Au, Al, Ni, and Cu may be used. The n-electrode 10 can be provided by conventional means well known in this technical field. In the case where the substrate 1 has conductivity, the n-electrode 10 is formed on the surface of the substrate 1 opposite to the surface on which the semiconductors are laminated. In such a case, the n-electrode 10 may be formed over the entire surface of the substrate 1, or may be formed only on a part of the surface of the substrate 1.

[Transparent p-electrode 13] A transparent p-electrode 13 is a transparent electrode that is formed on the p-type contact layer 9 of the epitaxial wafer fabricated as above. A material used for the transparent p-electrode 13 is not particularly limited so long as it has translucency and conductivity. For example, a material such as ITO ($In_2O_3$—$SnO_2$), AZO (ZnO—$Al_2O_3$), IZO ($In_2O_3$—ZnO), GZO (ZnO—$Ga_2O_3$) can be used.

The transparent p-electrode 13 may be formed so as to cover substantially the entire surface of the p-type contact layer 9, or may be formed in a lattice shape or a tree shape in a spaced manner. After formation of the transparent p-electrode 13, a thermal annealing treatment may be conducted so as to alloy or increase transparency. However, it may not be conducted.

[P-electrode bonding pad 12] A p-electrode bonding pad 12 is an electrode formed on the transparent p-electrode 13. The material used for the p-electrode bonding pad 12 may include Au, Al, Ni, and Cu. It is possible to use these known materials and compositions with these materials with no limitations whatsoever. The p-electrode bonding pad 12 has a thickness in the range of preferably 100 to 1000 nm, more preferably 300 to 500 nm. Although a thicker film increases bondability due to the characteristics of bonding pads, a thinner film is preferable in terms of manufacturing costs.

Next is a description of a manufacturing method of a group III nitride semiconductor light-emitting device according to the present embodiment.

The manufacturing method of a group III nitride semiconductor light-emitting device includes: a substrate 1 preprocessing step; a formation step (a lamination step) of the above group III nitride semiconductor layer; and an electrode formation step. The lamination step includes: a buffer layer 2 formation step; a foundation layer 3 formation step; an n-type contact layer 4 formation step; an n-type cladding layer 5 formation step; a multiple quantum well structure layer 20 formation step; a p-type cladding layer 8 formation step; and a p-type contact layer 9 formation step. Here, the multiple quantum well structure layer 20 formation step includes a repetition of the barrier layer 6 formation step and the well layer 7 formation step. Furthermore, the electrode formation step includes: an n-electrode 10 formation step; a transparent p-electrode 13 formation step; and a p-electrode bonding pad 12 formation step. The lamination step is a step of: first forming the buffer layer 2 by the sputtering method; next forming the foundation layer 3 by the MOCVD method; then forming the n-type contact layer 4 by the sputtering method; and finally forming the n-type cladding layer 5 to the p-type contact layer 9 by the MOCVD method.

Hereunder is a description of the respective steps.

[Substrate 1 preprocessing step] Only one surface of the substrate 1 is mirror polished so as to allow epitaxial growth, and then is introduced into a sputtering apparatus. The sputtering apparatus has a mechanism which has a radio frequency power source and rotates a magnet in a sputtering target to thereby cause a magnetic field applied area to be shifted.

It is preferable that the sputtering apparatus be a pulse DC sputtering apparatus or an RF sputtering apparatus. Use of a continuously discharging DC sputtering apparatus can make the sputtering target surface to be charged, resulting in unstable deposition rate. It is more preferable that a reactive sputtering method, which circulates a group V material in a reactor, be used as a deposition method because suppression of a reaction can maintain crystallinity favorably, and the favorable crystallinity is stably reproducible. Furthermore, in the case where an RF sputtering apparatus is used, it is preferable that the position of the magnet be moved in the target so as to form a film with a uniform thickness. Specific movements include a swaying motion and a rotation.

Nitrogen gas is released in the sputtering apparatus at a flow rate of around 15 sccm to bring the intrachamber pressure to 0.05 to 0.2 Pa, and then the pressure is kept constant. The substrate 1 is heated. The heating temperature of the substrate is 700 to 1200° C. A radio frequency bias of 30 to 70 W is applied to the substrate side to expose it to nitrogen plasma, to thereby clean the substrate surface. The magnet in the nitrogen plasma target should be kept in rotation.

[Buffer layer 2 formation step] After introduction of argon gas in addition to nitrogen gas, the substrate temperature is brought to 0 to 1000° C. With the intrachamber pressure kept to 0.3 Pa or more, argon gas and the nitrogen gas are introduced at a flow rate of around 15 sccm and at a flow rate of around 5 sccm, respectively. A radio frequency bias set to 2000 W is applied to the metal Al sputtering target side to generate plasma. AlN with a thickness of 50 nm is formed on the substrate 1 at a growth rate of around 0.1 nm/s, and the generation of plasma is stopped. In deposition, the magnet in the sputtering target should be in rotation.

The buffer layer 2 is required to play a role for solving the problem of a lattice mismatch in the element. Therefore, it is preferable that the buffer layer 2 be fabricated by the sputtering method, which is suitable for depositing a single composition crystal and is excellent in uniformity, productivity, and stability. The sputtering method is also excellent in that contamination such as dust in the chamber is minimal. Furthermore, the sputtering method is typically capable of suppressing the temperature of the substrate 1 low. Therefore, even in the case where a substrate 1 including a material with a property of being dissolved at high temperatures is used, it is possible to form respective layers on the substrate 1 without causing damage to the substrate 1. However, the buffer layer 2 may be formed by the pulsed laser deposition (PLD) method, the pulsed electron beam deposition (PED) method, the chemical vapor deposition (CVD) method, the MOCVD method, or the like.

It is preferable that the intrachamber pressure of the sputtering apparatus be 0.3 Pa or more. If it is less than 0.3 Pa, the presence of a small amount of nitrogen may allow the sputtered metal to be attached to the substrate 1 without a reaction into nitride. The upper limit of the pressure is not particularly limited. However, it is required that the pressure be suppressed to a degree that can generate plasma.

It is preferable that the ratio of the flow rate of nitrogen gas to the flow rate of argon gas be in the range of 20% or more and 99% or less. If the ratio is less than 20%, the sputtered metal may be attached, remaining as metal, to the substrate. If it is more than 99%, the sputtering rate may be decreased due to an insufficient amount of argon gas. In consideration of the stability of deposition, it is especially preferable that the ratio of the flow rate of nitrogen gas be in the range of 50% or more and 90% or less.

The substrate temperature is preferably in the range of 0 to 1000° C., more preferably in the range of 200 to 800° C. If the temperature of the substrate 1 is less than 0° C., the buffer layer 2 may not cover the entire surface of the substrate 1, and hence the surface of the substrate 1 may be exposed. If the substrate temperature is more than 1000° C., migration of the metal material becomes active. This may lead to the formation of a film not of a pillar crystal but of one close to a single crystal, which is not suitable for the buffer layer 2.

Among formation methods of doping a mixed crystal, a method that uses a mixture of metal materials (these need not form an alloy) as a sputtering target, and a method of simultaneously sputtering two sputtering targets made from different materials can be mentioned. In the case of forming a film with a given composition, a sputtering target of mixed materials is used. In the case of forming several types of films with different compositions, a plurality of sputtering targets may be placed in the chamber to perform simultaneous sputtering.

[Foundation layer 3 formation step] The substrate 1 on which the buffer layer 2 is formed is transferred into a chamber of an MOCVD apparatus. After introduction of nitrogen gas into the MOCVD apparatus, ammonia gas is introduced into the chamber at the time when the substrate temperature is increased to 830° C. Then, the substrate temperature is further increased to around 1050° C. to sublimate and remove contamination adhered to a buffer layer 2 surface. Subsequently, the substrate temperature is decreased to around 1020° C.

Then, a vapor, of for example TMG, which is generated by bubbling is circulated in the chamber to thereby form a foundation layer 3 including GaN with a thickness of 1 to 10 μm on the buffer layer 2 formed on the substrate 1.

<Crystallinity of foundation layer 3> It is preferable that as for crystallinity of the foundation layer 3, a full width at half maximum of an XRC measurement on a (10-10) plane, which is an asymmetrical plane, with a Cuβ-line X-ray generator used as a light source, be 300 arcsec or less. Furthermore, for a (0002) plane, which is a symmetrical plane, a full width at half maximum of an XRC measurement is preferably 150 arcsec or less, more preferably 100 arcsec or less. If the half values are larger than the above values, crystallinity required for the foundation layer 3 is insufficient. Therefore, depending on the sputtering method, there is a possibility that an n-type contact layer 4 with high crystallinity will not be formed on this foundation layer 3. Furthermore, it is preferable that the foundation layer 3 have a thickness of 1 μm or more in order to obtain good crystallinity. If the foundation layer 3 has a thickness of less than 1 μm, it is difficult to obtain favorable crystallinity. The thickness has no particular upper limit, but a thickness of around 5 μm is preferable in consideration of machinability and the time for processing. Furthermore, the foundation layer 3 may be formed by doping, or without doping.

It is desirable that the foundation layer 3 be formed by the MOCVD method because it needs to be a film with high crystallinity. In the MOCVD method, hydrogen gas, nitrogen gas, or the like is used as a carrier gas. As for group III raw materials, trimethyl gallium (TMG), triethyl gallium (TEG), or the like is used as a Ga source; trimethyl aluminum (TMA), triethyl aluminum (TEA), or the like is used as an Al source; and trimethyl indium (TMI), triethyl indium (TEI), or the like is used as an In source. As for a group V raw material, ammonia ($NH_3$), hydrazine ($N_2H_4$), or the like is used as an N source.

Furthermore, as a dopant, monosilane ($SiH_4$) or disilane ($Si_2H_6$) may be utilized as Si raw material, and an organic germanium compound such as germane gas ($GeH_4$), tetramethyl germanium (($CH_3)_4Ge$), or tetraethyl germanium (($C_2H_5)_4Ge$) may be utilized as a Ge raw material for the n-type. For the p-type, for example bis(cyclopentadienyl) magnesium ($Cp_2Mg$) or bis(ethylcyclopentadienyl)magnesium may be used as Mg raw material.

[n-type contact layer 4 formation step] The substrate 1 on which the layers up to the foundation layer 3 have been formed is transferred into a chamber of a sputtering apparatus. This sputtering apparatus has a mechanism which has a radio frequency power source and sweeps a magnet in a square Ga target to thereby cause a magnetic field applied area to be shifted. It also has a mechanism in which piping for circulating a coolant is deployed in the Ga sputtering target, and a coolant cooled to 20° C. is circulated in the piping to prevent the Ga from melting due to heat.

After introduction of argon gas and nitrogen gas into the chamber of the sputtering apparatus, the substrate temperature is increased to around 800° C. The magnet in the sputtering target is rotated so as to prevent it from being charged. A radio frequency bias at around 2000 W is applied to the Ga sputtering target side. The intrachamber pressure is maintained at around 0.5 Pa. Under conditions of an argon gas flow rate of around 10 sccm, and a nitrogen gas flow rate of around 10 sccm (the ratio of nitrogen to the whole gas being around 50%), an n-type contact layer 4 including monocrystalline GaN with a thickness of around 2 μm is sputter deposited on the foundation layer 3, at a growth rate of around 2 nm/s. After deposition, the plasma generation is stopped, and the apparatus is opened to the atmosphere. Then, the substrate 1 on which the layers up to the n-type contact layer 4 have been deposited is taken out of the chamber.

In the sputter deposition, it is typically more preferable that a reactive sputtering method be used in which a group V raw material such as a gas including nitrogen atoms ($N_2$, $NH_3$ or the like) is introduced into the chamber (reactor) of the sputtering apparatus with a group III metal being the sputtering target, and the group III metal and the nitrogen atoms are reacted in the vapor, it is possible to suppress the reaction to allow the crystallinity to be maintained favorable and stably reproduce the favorable crystallinity. Furthermore, if a DC sputtering which continuously discharges is used, there is a fierce electric charge; hence, it is difficult to control the deposition rate. Therefore, a pulse DC sputtering which can give a bias pulsewise or an RF sputtering is used. In forming the n-type contact layer 4 by the sputtering method, a high energy reactive material is preferably supplied to the substrate 1. Therefore the substrate 1 is preferably placed in the sputtering apparatus so as to be positioned in the plasma, and the sputtering target and the substrate 1 are preferably in a facing positional relationship. Furthermore, the distance between the substrate 1 and the sputtering target is preferably 10 mm to 100 mm. Furthermore, because it is desired that as few impurities as possible are left in the chamber, the ultimate vacuum in the sputtering apparatus is preferably $1.0 \times 10^{-3}$ Pa or less. It is desirable that the deposition rate of the group III nitride semiconductor by the sputtering method be 0.1 nm/s to 10 μm/s. If the deposition rate is faster than 10 μm/s, the laminated group III nitride semiconductor does not become crystalline but noncrystalline. If the deposition rate is slower than 0.1 nm/s, the process takes a needlessly long time; hence, industrial utilization is difficult. In the sputtering method, a larger bias is preferably applied to the target side. This is because a migration of the reactive material on the substrate surface can be activated, and the crystallinity can be enhanced. For example, in deposition, a bias applied to the target side is preferably around 2000 W. It is preferable that the intrachamber pressure of the sputtering apparatus be 0.3 Pa or more. If it is less than 0.3 Pa, the presence of a small amount of nitrogen may allow the sputtered metal to be attached to the substrate 1 without a reaction into nitride. The upper limit of the pressure is not particularly limited. However, it is required for the pressure to be suppressed to a degree that can generate plasma.

<Gas atmosphere> It is preferable that the deposition of the group III nitride semiconductor by the sputtering method be performed in a gas atmosphere composed of a gas including nitrogen atoms with a flow ratio of 20 to 80% and the balance of a gas including inert gas atoms. The gas including nitrogen atoms is plasmatized to be dissolved into nitrogen atoms. As a result, it becomes a raw material for a crystal growth, making it possible to grow the n-type contact layer 4 in a gas atmosphere rich in group III raw materials. Therefore, it is possible to grow an n-type contact layer 4 with good crystallinity. The gas including inert gas atoms may include hydrogen gas in addition to inert gas(es) such as argon gas. Furthermore, to sputter the sputtering target efficiently, a heavy, low-reactive inert gas such as argon gas is mixed. It is preferable that a ratio of the gas including nitrogen atoms in the gas atmosphere be 20% to 80%. For example, in the case where the gas atmosphere is composed of nitrogen gas and argon gas, it is preferable that a ratio of the gas flow rate of nitrogen gas to the gas flow rate of argon gas be 20% to 80%. If the ratio of the flow rate of nitrogen gas to argon gas is less than 20%, there arises a problem in that the sputtered metal attaches, remaining as metal without forming a compound. If the ratio of the flow rate of nitrogen gas to argon gas is more than 80%, there arises a problem in that there is a decrease in sputtering rate because the amount of argon gas is small.

It is more preferable that the deposition of the group III nitride semiconductor by the sputtering method be performed in a gas atmosphere composed of a gas including nitrogen atoms with a flow ratio of 20 to 50% and the balance of a gas including inert gas atoms. The presence of a sufficient amount of gas including inert gas atoms makes the sputtering rate relatively fast. In addition, the presence of a sufficient amount of gas including nitrogen atoms allows a group III nitride semiconductor with good crystallinity to be deposited.

<Substrate temperature> It is preferable that the substrate temperature be 600 to 1200° C. when the group III nitride semiconductor is deposited by the sputtering method. If the substrate temperature is lower than 600° C., a migration of the reactive material on the substrate surface is suppressed, and hence it is difficult to form an n-type contact layer 4 with a good crystallinity. If the substrate temperature is higher than 1200° C., there is a possibility that the formed n-type contact layer 4 will be re-dissolved.

It is more preferable that the substrate temperature be 800 to 1000° C. when the group III nitride semiconductor is deposited by the sputtering method. This temperature range activates a migration of the reactive material on the substrate surface, and also eliminates the possibility of occurrence of re-dissolution.

To form the n-type contact layer 4 as a mixed crystal, a method is available in which a mixture of metal materials (these need not form an alloy) is used as a sputtering target. For example, in the case of forming an AlGaN layer, an AlGa alloy is used as a sputtering target. In the case of forming an InGaN layer, an InGa alloy is used as a sputtering target. Furthermore, another method is also available in which two sputtering targets made from different materials are simultaneously sputtered. In the case of forming a film with a given composition, a sputtering target of mixed materials is used. In the case of forming several types of films with different compositions, a plurality of sputtering targets may be placed in the chamber to perform simultaneous sputtering.

Doping of the n-type contact layer 4 with an n-type dopant can be performed with the simultaneous presence of a group III metal and a raw material of impurity, as a sputtering target. For example, in the case of doping GaN with Si, placing a small piece of Si together with a Ga metal as a sputtering target can form GaN doped with Si. In the case of placing a small piece of Si on a surface of a solid Ga for use as a sputtering target, it is possible to form an n-type GaN monocrystalline layer with a carrier concentration of $1 \times 10^{18}$ to $8 \times 10^{19}/cm^3$ as an n-type contact layer 4, with a ratio of the surface area of the Si small piece to the surface area of the Ga being 0.1 to 5%. Other than Si, germanium (Ge) or tin (Sn) may be similarly used as an n-type dopant. Furthermore, it is also possible to use a Ga metal in a molten state at elevated temperatures as a sputtering target. By experimentally finding a ratio between Ga and Si so as to serve as a sputtering target, GaN with a desired impurity concentration can be formed.

The GaN doped with an n-type dopant and formed by the sputtering method in this manner can be used as an n-type contact layer 4. An n-type contact layer 4 is a layer for forming an n-electrode when the group III nitride semiconductor light-emitting device is formed. Typically in a group III nitride semiconductor light-emitting device that often uses an insulating entity as a substrate, etching is often used to expose the n-type contact layer 4 to thereby form an n-electrode. The n-type contact layer 4 has a function of sending current in the lateral direction and a function of implanting carriers into a functional layer such as a light-emitting layer. Therefore, the n-type contact layer 4 fabricated by the sputtering method, which is excellent in forming a flat film, has an effect of, for example, reducing current leakage and improving ESD resistance.

[n-type cladding layer 5 formation step] A deposition method of an n-type cladding layer 5 is not particularly limited. All the methods that are known to grow a nitride semiconductor, such as the sputtering method, the MOCVD method, the hydride vapor phase epitaxy (HVPE) method, the MBE method, can be adopted. A preferable growth method is the MOCVD method in terms of film thickness controllability and mass productibility.

Note that the barrier layer 6, the well layer 7, the multiple quantum well structure layer 20, and the p-type cladding layer 8, which are formed in the later steps, are also preferably formed by the MOCVD method.

As a specific procedure of forming an n-type cladding layer 5, the substrate is heat cleaned, and then the temperature is decreased to approximately 700° C. After that, while ammonia gas is circulated, monosilane gas and vapors of TMI and TEG generated by bubbling are released into the chamber, to thereby form an n-type cladding layer 5 including Si-doped $In_{0.1}Ga_{0.9}N$ with a thickness of 1 to 100 nm so as to have an electron concentration of $1 \times 10^{17}$ to $3 \times 10^{19}$ cm$^{-3}$. After that, the valves of the TMI, the TEG, and monosilane gas are switched to stop the supply of these raw materials.

[Barrier layer 6 formation step] After completion of the growth of the n-type cladding layer 5 including Si-doped $In_{0.1}Ga_{0.9}N$, the valve of the TEG is switched to supply the TEG into the chamber with the substrate temperature, the intrachamber pressure, and the flow rate and type of the carrier gas remain unchanged. Thereby, a barrier layer 6 including GaN with a thickness of 1 to 100 nm is formed.

[Well layer 7 formation step] After completion of the growth of the barrier layer 6 including GaN, the valves of the TEG and the TMI are switched to supply the TEG and the TMI into the chamber with the substrate temperature, the intrachamber pressure, and the flow rate and type of the carrier gas remain unchanged. Thereby, a well layer 7 including $In_{0.2}Ga_{0.8}N$ with a thickness of 1 to 50 nm is formed.

[Multiple quantum well structure layer 20 formation step] After completion of the growth of the well layer 7 including $In_{0.2}Ga_{0.8}N$, a barrier layer 6 including GaN is grown again. Such a procedure is repeated five times to fabricate five barrier layers 6 including GaN and five well layers 7 including $In_{0.2}Ga_{0.8}N$. Furthermore, a barrier layer 6 including GaN is formed on the final well layer 7 including $In_{0.2}Ga_{0.8}N$, to thereby form a multiple quantum well structure layer 20.

[p-type cladding layer 8 formation step] The intrachamber pressure is changed to 50 to 800 mbar, the substrate temperature is changed to 850 to 1100° C., and the carrier gas is changed from nitrogen gas to hydrogen gas, and time is given to allow the intrachamber pressure and the temperature to become stable. Then, the valves of the TEG, the TMA, and the $Cp_2Mg$ are switched to start the supply of these raw materials into the chamber. Thereby, a p-type cladding layer 8 including Mg-doped $Al_{0.2}Ga_{0.8}N$ with a thickness of 1 to 50 nm is formed.

[p-type contact layer 9 formation step] With the temperature, the pressure, and the carrier gas kept the same as those in the growth of the p-type cladding layer 8, the supply of the TMA, the TMG, and the $Cp_2Mg$ into the chamber is started, and a growth is performed. A circulation amount of the $Cp_2Mg$, which is previously examined, is adjusted so that the hole concentration is $8 \times 10^{17}$ cm$^{-3}$. Then, a p-type contact layer 9 including Mg-doped $Al_{0.2}Ga_{0.98}N$ with a thickness of 50 to 1000 m is formed. After completion of the growth of the p-type contact layer 9 including Mg-doped $Al_{0.2}Ga_{0.98}N$, the heater is stopped, and the substrate temperature is lowered to room temperature. Immediately after completion of the growth, the flow rate of ammonia gas is reduced to ⅕₀, and the carrier gas is switched from hydrogen gas to nitrogen gas. After that, at a temperature of 950° C., ammonia gas is completely stopped. After it is confirmed that the substrate temperature has been lowered to room temperature, the substrate 1 after deposition is taken out into the atmosphere.

Although the sputtering method, the MOCVD method, the MBE method, or the like may be used for the p-type contact layer 9, use of the sputtering method or the MBE method is recommended. The sputtering method or the MBE method allows a p-type semiconductor to be obtained without an activation annealing treatment. Therefore, it is possible to avoid the risk of impairing a light-emitting output due to a breakage of the light-emitting layer by the activation annealing.

[Electrode formation step] A known photolithography technique is used to form: a transparent p-electrode including ITO and the like on the surface of the p-type contact layer; and a p-electrode bonding pad including Au and the like on top of the surface thereof, which are used as a p-side electrode. Next, dry etching is performed to expose a portion for forming an n-side electrode of the n-type contact layer. Then, an n-side electrode including Al and the like is fabricated on the exposed portion. Furthermore, a back surface of the sapphire substrate is ground and polished to a specular surface. After that, the sapphire substrate is cut into chips about 350 μm square. Each of them is placed on a lead frame so that the electrodes face upward, and is connected to the lead frame with gold wires, to thereby form a light-emitting diode.

In the manufacturing process of a group III nitride semiconductor light-emitting device, a p-type contact layer 9 may be formed on a foundation layer 3 by adding a p-type dopant instead of an n-type dopant when the n-type contact layer 4 is formed. In this case, the order of depositing the respective layers is modified. As a result, the group III nitride semiconductor light-emitting device has a structure in which a buffer layer 2, foundation layer 3, a p-type contact layer 9, a p-type cladding layer 8, a multiple quantum well structure layer 20, an n-type cladding layer 5, and an n-type contact layer 4 are laminated in this order on a substrate 1. Here, the multiple quantum well structure layer 20 is made of a plurality of barrier layers 6 and a plurality of well layers 7. Furthermore, a transparent p-electrode 13 and a p-electrode bonding pad 12 are formed on an exposed surface portion of the p-type contact layer 9. In addition, on the n-type contact layer 4, an n-electrode 10 is formed. Here, the n-type electrode 10 is made from Au which is formed thin to have translucency. Thereby, it is possible to extract light from a top surface of the n-type contact layer 4. As a p-type dopant, Mg, Zn, or the like may be used.

Hereunder is a description of effects of the present embodiment.

In the manufacturing method of a group III nitride semiconductor according to the present embodiment, a sputter deposition is performed in a gas atmosphere composed of a gas including nitrogen atoms with a flow ratio of 20 to 80% and the balance of a gas including inert atoms. As a result, the sputter deposition is performed at elevated substrate temperatures in an atmosphere with the presence of abundant raw materials for constituting the n-type contact layer 4. Therefore, it is possible to enhance the crystallinity of the n-type contact layer 4, and also to improve productivity.

Especially in the case where an sputter deposition is performed by use of a Ga sputtering target, it is possible to efficiently form a GaN layer with high crystallinity in a gas atmosphere composed of nitrogen gas and argon gas, at a substrate temperature of 600° C. or higher and 1200° C. or lower.

Furthermore, in the manufacturing method of a group III nitride semiconductor according to the present embodiment, a foundation layer 3 including a monocrystalline group III nitride semiconductor with high crystallinity such that a full width at half maximum of an XRC measurement in an (10-10) plane orientation is 300 arcsec or less, is formed on the substrate 1 by the MOCVD method, with a thickness of 1 µm or more. Then, the above sputter deposition is performed on the foundation layer 3. Therefore, without the use of the MOCVD method, it is possible to easily form an n-type contact layer 4 with high crystallinity by the reactive sputtering method.

Furthermore, in the manufacturing method of a group III nitride semiconductor according to the present embodiment, it is possible to form a monocrystalline n-type contact layer 4 that includes donor impurities and has n conductivity. As a result, it is possible to form an n-type contact layer 4 excellent not only in crystallinity but also in conductivity. Therefore, the method can be used for the manufacture of: various semiconductor elements such as an n-type contact layer of an LED or an LD; and electronic devices such as a FET.

Hereunder is a specific description of the present invention based on examples. However, the present invention is not limited to these examples.

EXAMPLES

Example 1

A (0001) c-plane sapphire substrate with a diameter of 2 inches whose surface was mirror-polished is cleaned with a hydrofluoric acid and an organic solvent, and was then introduced into a chamber of a sputtering apparatus. The sputtering apparatus had a mechanism which had a radio frequency power source and rotated a magnet in a sputtering target to thereby cause a magnetic field applied area to be shifted.

[Substrate cleaning] Nitrogen gas was introduced into the chamber at a flow rate of 15 sccm, and then a substrate temperature was increased to 750° C. Furthermore, with an intrachamber pressure maintained at 0.08 Pa, a radio frequency bias at 50 W was applied to the substrate side while rotating a magnet in a sputtering target, to expose the substrate surface to $N_2$ plasma. Thereby, the substrate was cleaned. After that, the plasma generation was stopped.

[Buffer layer formation] Next, in addition to nitrogen gas, argon gas was newly introduced, and the substrate temperature was decreased to 500° C. The magnet in the sputtering target was rotated, and a radio frequency bias at 2000 W was applied to an Al metal sputtering target side. With the intrachamber pressure maintained at 0.5 Pa, AlN was deposited on the sapphire substrate an argon gas flow rate of 15 sccm and a nitrogen gas flow rate of 5 sccm (the ratio of $N_2$ to the whole gas being 25%). The growth rate was 0.12 nm/s. After deposition of 50 nm AlN, the generation of plasma was stopped. As a result, a buffer layer made from polycrystalline AlN with a thickness of 50 nm was formed on the substrate.

[Substrate cleaning] The substrate on which the buffer layer had been formed was taken out of the sputtering apparatus, and was transferred into a chamber of an MOCVD apparatus. In a state with hydrogen gas being circulated in the chamber, the substrate temperature was increased. After the substrate temperature reached 830° C., ammonia gas was also circulated in the chamber.

Finally, the substrate temperature was maintained at 1050° C. for a given period of time, to thereby sublimate and remove contamination adhered to a surface of the buffer layer.

[Foundation layer formation] The substrate temperature was decreased to 1020° C., and then hydrogen gas was stopped. In a state with ammonia gas being circulated as it was, a vapor of TMG generated by bubbling was circulated in the chamber, to thereby form a foundation layer made from monocrystalline GaN with a thickness of 6 µm. After that, supply of the TMG was stopped, and the temperature was allowed to decrease.

An XRC measurement was performed for the foundation layer. The measurement was performed on a (0002) plane, which was a symmetrical plane, and on a (10-10) plane, which was an asymmetrical plane, with a Cuβ-line X-ray generator used as a light source. The foundation layer showed a full width at half maximum of 80 arcsec in the measurement on the (0002) plane, and a full width at half maximum of 250 arcsec in the measurement on the (10-10) plane. Furthermore, the foundation layer was not doped with impurities. Therefore, the foundation layer had a high resistance.

[n-type contact layer formation] Next, the substrate on which the foundation layer had been formed was transferred into a chamber of a sputtering apparatus. This sputtering apparatus had a mechanism which had a radio frequency power source and swept a magnet in a square Ga sputtering target to thereby cause a magnetic field applied area to be shifted. It also had a mechanism in which piping for circulating a coolant was deployed in the Ga sputtering target, and a coolant cooled to 20° C. was circulated in the piping to prevent the Ga from melting due to heat.

Argon gas and nitrogen gas were introduced into the chamber of the sputtering apparatus, and the substrate temperature was increased to 800° C. The magnet in the sputtering target was rotated, and a radio frequency bias at 2000 W was applied to a Ga sputtering target side. With the intrachamber pressure maintained at 0.5 Pa, monocrystalline GaN was deposited on the foundation layer under the conditions of an argon gas flow rate of 10 sccm and a nitrogen gas flow rate of 10 sccm (the ratio of $N_2$ to the whole gas being 50%). The growth rate was 2 nm/s. After deposition of a group III nitride semiconductor made from GaN with a thickness of 2 µm, the generation of plasma was stopped.

A surface of the n-type contact layer was specular and transparent. An XRC measurement was performed therefor, similar to the foundation layer. As shown in Table 1, in the n-type contact layer, the (10-10) plane, which was an asymmetrical plane, had a full width at half maximum of 265 arcsec, the value of which was substantially the same as that for the foundation layer. This reveals that the foundation layer and the n-type contact layer were substantially the same in crystallinity. As for the symmetrical plane, the measurement was not performed because there was a high probability that the data of the foundation layer was picked up.

TABLE 1

| | XRC (unit: arcsec) | | |
|---|---|---|---|
| | symmetrical plane (0002) plane | asymmetrical plane (10-10) plane | crystallinity |
| foundation layer | 80 | 250 | good |
| n-type contact layer | — | 265 | good |

Example 2

In Example 2, a sample made of a buffer layer, a foundation layer, and an n-type contact layer was fabricated in the same condition as in Example 1, the exception being that Si doping was performed in forming the n-type contact layer. The Si doping was formed by the sputter deposition with an Si small piece being placed on the Ga sputtering target. The ratio of a surface area of the Si small piece to that of a Ga metal in the Ga sputtering target was approximately 0.2%.

A surface of the n-type contact layer of the sample obtained in Example 2 was specular and transparent. A Hall effect measurement on the n-type contact layer was performed, which showed n-type conductivity and a carrier concentration of $2\times10^{18}/cm^3$. The results of Example 2 are shown in Table 2.

TABLE 2

|  |  | Example 2 |
|---|---|---|
| gas atmosphere | Argon gas flow rate (sccm) | 10 |
|  | Nitrogen gas flow rate (sccm) | 10 |
|  | gas flow ratio of $N_2$ to Ar | 50% |
| Hall effect measurement | conductivity | n-type |
|  | carrier concentration (unit:/cm$^3$) | $2 \times 10^{18}$ |
|  | crystallinity | good |

Example 3

In Example 3, a sample made of a buffer layer, a foundation layer, and an n-type contact layer was fabricated similar to Example 2, the exception being that when the n-type contact layer was formed, a substrate temperature was 900° C. and that the intrachamber gas atmosphere had an argon gas flow rate of 5 sccm and a nitrogen gas flow rate of 15 sccm (the ratio of $N_2$ to the whole gas being 75%).

A surface of the n-type contact layer of the sample obtained in Example 3 was specular and transparent. A Hall effect measurement on the n-type contact layer was performed. It showed n-type conductivity and a carrier concentration of $7\times10^9/cm^3$.

Comparative Example 1

In Comparative Example 1, a sample made of a buffer layer, a foundation layer, and an n-type contact layer was fabricated similar to Example 3, the exception being that when the n-type contact layer was formed, the substrate temperature was 500° C.

A surface of the n-type contact layer of the sample obtained in Comparative Example 3 was yellowish and transparent. Furthermore, when a Hall effect measurement on the n-type contact layer was performed, an electrical measurement was not possible. This was conceivably because the GaN layer had poor crystallinity, which made it impossible to control conductivity. The results of Example 3 and Comparative Example 1 are shown in Table 3.

TABLE 3

|  |  | Example 3 | Comparative Example 1 |
|---|---|---|---|
| gas atmosphere | Argon gas flow rate (sccm) | 5 | 5 |
|  | Nitrogen gas flow rate (sccm) | 15 | 15 |
|  | gas flow ratio of $N_2$ to argon | 75% | 75% |
|  | substrate temperature (° C.) | 900 | 500 |
|  | surface condition | specular and transparent | yellowish and transparent |
|  | crystallinity | good | bad |

Example 4

First, a (0001) c-plane sapphire substrate with a diameter of 2 inches whose surface was mirror-polished was cleaned with a hydrofluoric acid and an organic solvent, and was then introduced into a chamber of a sputtering apparatus. The sputtering apparatus had a mechanism which had a radio frequency power source and rotated a magnet in a sputtering target to thereby cause a magnetic field applied area to be shifted.

[Substrate cleaning] Nitrogen gas was introduced into the chamber at a flow rate of 15 sccm, and then a substrate temperature was increased to 750° C. Furthermore, with an intrachamber pressure maintained at 0.08 Pa, a radio frequency bias at 50 W was applied to the substrate side while rotating a magnet in a sputtering target, to expose the substrate surface to $N_2$ plasma. Thereby, the substrate was cleaned. After that, the plasma generation was stopped.

[Buffer layer formation] Next, in addition to nitrogen gas, argon gas was newly introduced, and the substrate temperature was decreased to 500° C. The magnet in the sputtering target was rotated, and a radio frequency bias at 2000 W was applied to an Al metal target side. With the intrachamber pressure maintained at 0.5 Pa, AlN was deposited on the sapphire substrate with an argon gas flow rate of 15 sccm and a nitrogen gas flow rate of 5 sccm (the ratio of $N_2$ to the whole gas being 25%). The growth rate was 0.12 nm/s. After deposition of 50 nm AlN, the generation of plasma was stopped. As a result, a buffer layer made from polycrystalline AlN with a thickness of 50 nm was formed on the substrate.

[Substrate cleaning] The substrate on which the buffer layer had been formed was taken out of the sputtering apparatus, and was transferred into a chamber of an MOCVD apparatus. In a state with hydrogen gas being circulated in the chamber, the substrate temperature was increased. After the substrate temperature reached 830° C., ammonia gas was also circulated in the chamber.

Finally, the substrate temperature was maintained at 1050° C. for a given period of time, to thereby sublimate and remove contamination adhered to a surface of the buffer layer.

[Foundation layer formation] The substrate temperature was decreased to 1020° C., and then hydrogen gas was stopped. In a state with ammonia gas being circulated, a vapor of TMG generated by bubbling was circulated in the chamber, to thereby form a foundation layer made from monocrystalline GaN with a thickness of 2 μm. After that, supply of the TMG was stopped, and the temperature was allowed to decrease.

[n-type contact layer formation] Next, the substrate on which the foundation layer had been formed was transferred into a chamber of a sputtering apparatus. This sputtering apparatus had a mechanism which had a radio frequency power source and swept a magnet in a square Ga sputtering target to thereby cause a magnetic field applied area to be shifted. It also had a mechanism in which piping for circulating a coolant was deployed in the Ga sputtering target, and a coolant cooled to 20° C. was circulated in the piping to prevent the Ga from melting due to heat. Furthermore, to perform a Si doping, a small Si piece was placed on the Ga sputtering target. The ratio of the surface area of the Si piece to that of a Ga metal in the Ga sputtering target was approximately 0.2%.

Argon gas and nitrogen gas were introduced into the chamber of the sputtering apparatus, and the substrate temperature was increased to 800° C. The magnet in the sputtering target was rotated, and a radio frequency bias at 2000 W was applied to a Ga sputtering target side. With the intrachamber pressure maintained at 0.5 Pa, Si-doped monocrystalline GaN was deposited on the foundation layer 3 with an argon gas flow rate of 10 sccm and a nitrogen gas flow rate of 10 sccm (the ratio of $N_2$ to the whole gas being 50%). The growth rate was 2 nm/s. After deposition of an n-type contact layer made from Si-doped GaN with a thickness of 2 μm, the generation of plasma was stopped.

[Substrate cleaning] Next, the substrate was transferred into a chamber of an MOCVD apparatus. The atmosphere in the chamber was replaced with nitrogen gas, and then the substrate temperature was increased. After the substrate temperature reached 830° C., ammonia gas was also circulated in the chamber. Finally, the substrate temperature was maintained at 1000° C. for a given period of time, to thereby sublimate and remove contamination adhered to a topmost surface of the n-type contact layer made from Si-doped GaN.

[n-type cladding layer formation] Subsequently, the substrate temperature was decreased to 740° C., and nitrogen gas stopped. While ammonia gas was circulated, monosilane gas and vapors of TMI and TMG generated by bubbling were circulated into the chamber, to thereby form a Si-doped $In_{0.1}Ga_{0.9}N$ cladding layer with a thickness of 18 nm. After that, the valves of the TMI, the TMG and monosilane gas are switched off to stop the supply of these raw materials.

[Multiple quantum well structure layer formation] Next, a multiple quantum well structure layer made of GaN barrier layers and $In_{0.2}Ga_{0.9}N$ well layers was fabricated. In fabricating the multiple quantum well structure layer, an GaN barrier layer was first formed on an Si-doped $In_{0.1}Ga_{0.9}N$ cladding layer, and then an $In_{0.2}Ga_{0.8}N$ well layer was formed on the GaN barrier layer. After five repetitions of this structure to form a lamination, a sixth GaN barrier layer was formed on a fifth $In_{0.2}Ga_{0.9}N$ well layer. Thereby, the multiple quantum well structure layer was sandwiched by the GaN barrier layers on both surfaces. That is, after completion of the growth of an Si-doped $In_{0.1}Ga_{0.9}N$ cladding layer, the valve of TEG was switched so as to supply the TEG into the chamber with the substrate temperature, the intrachamber pressure, and the flow rate and type of the carrier gas remained as they were. Thereby, a GaN barrier layer was grown. As a result, a GaN barrier layer with a thickness of 15 nm was formed.

After completion of the growth of a GaN barrier layer, the valves of TEG and TMI were switched so as to supply the TEG and the TMI into the chamber with the substrate temperature, the intrachamber pressure, and the flow rate and type of the carrier gas remained as they were. Thereby, an $In_{0.2}Ga_{0.8}N$ well layer was grown. As a result, an $In_{0.2}Ga_{0.8}N$ well layer with a thickness of 2 nm was formed. A procedure of growing a GaN barrier layer again after completion of the growth of an $In_{0.2}Ga_{0.8}N$ well layer was repeated five times to fabricate five GaN barrier layers and five $In_{0.2}Ga_{0.9}N$ well layers. After that, a sixth GaN barrier layer was finally formed, to thereby form a multiple quantum well structure layer.

[p-type cladding layer formation] Furthermore, the intrachamber pressure was changed to 200 mbar, the substrate temperature was changed to 1020° C., and the carrier gas was changed from nitrogen gas to hydrogen gas. Time was given to allow the intrachamber pressure and the substrate temperature to be stable. Then, the valves of TMG, TMA, and bis (cyclopentadienyl) magnesium (hereinafter referred to as $Cp_2Mg$) were switched so as to supply these raw materials into the chamber. Thereby, a p-type cladding layer made from Mg-doped $Al_{0.1}Ga_{0.9}N$ with a thickness of 3 nm was formed.

[p-type contact layer formation] Finally, with the intrachamber pressure, the substrate temperature, and the flow rate and type of the carrier gas kept the same as those in the growth of the p-type cladding layer, the TMA, the TMG, and the $Cp_2Mg$ were supplied into the chamber. Thereby, a p-type contact layer made from Mg-doped $Al_{0.02}Ga_{0.98}N$ with a thickness of 150 nm was formed. A circulation amount of the $Cp_2Mg$ had been previously adjusted so that a hole concentration of the p-type contact layer made from Mg-doped $Al_{0.02}Ga_{0.98}N$ was $8\times10^{17}$ cm$^{-1}$.

After completion of the growth of the p-type contact layer made from Mg-doped $Al_{0.02}Ga_{0.98}N$, the flow rate of ammonia was reduced to 1/50, and the carrier gas was switched from hydrogen gas to nitrogen gas. After that, at a temperature of 950° C., ammonia gas was completely stopped. Furthermore, the heater was stopped, and the substrate temperature was allowed to decrease for 20 minutes. After it was confirmed that the substrate temperature was decreased to about 300° C., the wafer together with the wafer tray was taken out into the atmosphere via a load lock. Through the procedure as described above, an epitaxial wafer with an epitaxial layer structure for a semiconductor light-emitting device was fabricated. Here, the p-type cladding layer made from Mg-doped $Al_{0.1}Ga_{0.9}N$ and the p-type contact layer made from Mg-doped $Al_{0.02}Ga_{0.98}N$ showed p-type, even without being subjected to an annealing treatment for activating p-type carriers.

That is, the epitaxial wafer had a structure in which: on a sapphire substrate with a c-plane, there was first formed a buffer layer made from polycrystalline AlN with a thickness of 50 nm; and thereon, there were then formed: a foundation layer made from GaN with a thickness of 2 μm; an n-type contact layer made from Si-doped GaN with a thickness of 2 μm with a carrier concentration of $4\times10^{19}$ cm$^{-3}$; an n-type cladding layer made from $In_{0.1}Ga_{0.9}N$ with a thickness of 180 Å with a carrier concentration of $1\times10^{18}$ cm$^{-3}$; an undoped multilayer quantum well structure (light-emitting layer) having six GaN barrier layers each with a thickness of 15 nm and five $In_{0.2}Ga_{0.9}N$ well layers each with a thickness of 2 nm, the multilayer quantum well structure starting with a GaN barrier layer and ending with a GaN barrier layer; a p-type cladding layer made from Mg-doped $Al_{0.1}Ga_{0.9}N$ with a thickness of 3 nm; and a p-type contact layer made from Mg-doped $Al_{0.02}Ga_{0.98}N$ with a thickness of 150 nm, these layers being laminated in this order from the substrate side.

Next, the epitaxial wafer was used to fabricate group III nitride semiconductor light-emitting devices. A known photolithography technique was used to form, on the surface of the p-type contact layer made from Mg-doped $Al_{0.02}Ga_{0.98}N$, a transparent p-electrode made from ITO was formed, and to form thereon a p-electrode bonding pad made of three layers of Ti, Al, and Au laminated in this order. These two were used as a p-side electrode. Next, the epitaxial wafer was dry-etched to expose a portion on which is to be formed an n-side electrode of the n-type contact layer made from Si-doped GaN. Then, on the exposed portion, an n-side electrode made from four layers of Ni, Al, Ti, and Au was fabricated.

Furthermore, a back surface of the sapphire substrate of the epitaxial wafer on which were formed the p-side and n-side electrodes was ground and polished to a specular surface. After that, the epitaxial wafer was cut into chips 350 μm square. Each of them was placed on a lead frame so that the electrodes face upward, and was connected to a lead frame with gold wires, to thereby form a light-emitting diode. When a forward current was passed between the p-side electrode and the n-side electrode of the light emitting diode, a current of 20 mA passed at a forward voltage of 3.0 V. Furthermore, when light emission was observed through the p-side transparent electrode, the emission wavelength showed 470 nm and the emission output showed 13 mW. As for light-emitting diodes fabricated from substantially the whole surface of the epitaxial wafer, such light-emitting diode characteristics were obtained without variation.

INDUSTRIAL APPLICABILITY

According to the present invention, it is possible to fabricate a group III nitride semiconductor with high crystallinity in which conductivity is controlled to be n-type by the addition of donor impurities. Therefore, the present invention is applicable to the manufacture of various semiconductor elements such as an n-type contact layer of an LED and an LD, and an electronic device such as a FET.

The invention claimed is:

1. A manufacturing method of a group III nitride semiconductor light-emitting device, comprising
   a lamination step of forming a plurality of lamination films including a group III nitride semiconductor on a substrate, wherein
   a substrate on which is formed a foundation layer including a monocrystalline group III nitride semiconductor is used as the substrate,
   the substrate including the foundation layer and a target made from a group III metal or an alloy including a group III metal is placed in a sputtering chamber, and
   the lamination films are formed on the foundation layer by a sputtering method.

2. The manufacturing method of a group III nitride semiconductor light-emitting device according to claim 1, wherein
   the foundation layer has a thickness of 1 μm or more.

3. The manufacturing method of a group III nitride semiconductor light-emitting device according to claim 1, wherein
   in the foundation layer, a full width at half maximum of an X-ray rocking curve measurement is 300 arcsec or less in a (10-10) plane orientation.

4. The manufacturing method of a group III nitride semiconductor light-emitting device according to claim 1, wherein the foundation layer is formed by a metal organic chemical vapor deposition method.

5. The manufacturing method of a group III nitride semiconductor light-emitting device according to claim 1, wherein
   a substrate temperature is 600° C. to 1200° C.

6. The manufacturing method of a group III nitride semiconductor light-emitting device according to claim 1, wherein
   a substrate temperature is 800° C. to 1000° C.

7. The manufacturing method of a group III nitride semiconductor light-emitting device according to claim 1, wherein
   the lamination films are formed by a sputtering method under a gas atmosphere composed of a gas including nitrogen atoms with a flow ratio of 20% to 80% and the balance of a gas including inert atoms.

8. The manufacturing method of a group III nitride semiconductor light-emitting device according to claim 7, wherein
   the gas atmosphere is composed of a gas including nitrogen atoms which is made from a nitrogen gas and a gas including inert atoms which is made from argon gas.

9. The manufacturing method of a group III nitride semiconductor light-emitting device according to claim 7, wherein
   the gas including nitrogen atoms has a flow ratio of 50% or less.

10. The manufacturing method of a group III nitride semiconductor light-emitting device according to claim 1, wherein
    when the lamination film is formed by a sputtering method, Mg and Zn are added as p-type dopants.

11. The manufacturing method of a group III nitride semiconductor light-emitting device according to claim 1, wherein
    when the lamination film is formed by a sputtering method, Si, Ge, and Sn are added as n-type dopants.

12. The manufacturing method of a group III nitride semiconductor light-emitting device according to claim 10, wherein
    the lamination film to which are added the p-type dopants and/or the n-type dopants is used as a contact layer for forming an electrode.

* * * * *